(12) United States Patent
Kim et al.

(10) Patent No.: US 11,139,220 B2
(45) Date of Patent: Oct. 5, 2021

(54) FLEXIBLE SEMICONDUCTOR PACKAGE FORMED BY ROLL-TO-ROLL PROCESS

(71) Applicant: HAESUNG DS CO., LTD., Changwon-si (KR)

(72) Inventors: Jea Won Kim, Chungju-si (KR); Chong Han Park, Changwon-si (KR); Jong Woo Park, Yongin-si (KR)

(73) Assignee: HAESUNG DS CO., LTD., Changwon-si (KR)

( * ) Notice: Subject to any disclaimer, the term of this patent is extended or adjusted under 35 U.S.C. 154(b) by 0 days.

(21) Appl. No.: 16/854,679

(22) Filed: Apr. 21, 2020

(65) Prior Publication Data

US 2021/0057301 A1   Feb. 25, 2021

(30) Foreign Application Priority Data

Aug. 19, 2019   (KR) .......................... 10-2019-0101221

(51) Int. Cl.
*H01L 23/31*   (2006.01)
*H01L 23/00*   (2006.01)
*H01L 21/56*   (2006.01)

(52) U.S. Cl.
CPC ........ *H01L 23/3107* (2013.01); *H01L 21/565* (2013.01); *H01L 24/05* (2013.01); *H01L 24/20* (2013.01)

(58) Field of Classification Search
CPC combination set(s) only.
See application file for complete search history.

(56) References Cited

U.S. PATENT DOCUMENTS

| 2009/0289340 A1* | 11/2009 | Yamazaki | G06K 19/07749 257/679 |
| 2012/0074599 A1* | 3/2012 | Kim | H01L 21/565 257/793 |
| 2016/0322332 A1* | 11/2016 | Kim | H01L 25/105 |
| 2020/0239653 A1* | 7/2020 | Yoshida | H05K 1/036 |

* cited by examiner

*Primary Examiner* — Mamadou L Diallo
(74) *Attorney, Agent, or Firm* — Schwabe, Williamson & Wyatt, P.C.

(57) ABSTRACT

A flexible semiconductor package includes a semiconductor chip accommodated in a cavity formed in a substrate, a molding layer covering an entire upper surface of the substrate and the cavity, and a wiring portion including an insulating layer and a redistribution member provided under lower surfaces of the substrate and the semiconductor chip, wherein the molding layer includes a pre-preg in which a resin is impregnated with a glass fabric, and the molding layer and the insulating layer are attached to the semiconductor chip accommodated in the cavity by a roll-to-roll continuous process.

20 Claims, 9 Drawing Sheets

FLEXIBLE SEMICONDUCTOR PACKAGE FORMED BY ROLL-TO-ROLL PROCESS

CROSS-REFERENCE TO RELATED APPLICATION

This application claims the benefit of Korean Patent Application No. 10-2019-0101221, filed on Aug. 19, 2019, in the Korean Intellectual Property Office, the disclosure of which is incorporated herein in its entirety by reference.

BACKGROUND

1. Field

The inventive concept relates to a flexible semiconductor package and a method of manufacturing the flexible semiconductor package, and more particularly, to a flexible semiconductor package and a method of manufacturing the flexible semiconductor package, for manufacturing a panel level package to which a roll-to-roll process can be applied.

2. Description of Related Art

Recently, according to the development of electronic industries and the needs of users, electronic devices have been more highly functional and miniaturized, and high density integration and high density mounting of electronic components are required. Accordingly, in order to realize high performance and high capacity while miniaturizing semiconductor packages used in electronic devices and reducing the weight of the semiconductor packages, research and development on panel level packages (PLPs) and manufacturing methods thereof have been conducted.

Panel level packaging may refer to a process of packaging in an uncut panel state and then dicing a panel into semiconductor chips. For example, packaging may be performed in units of square panels of about 400 mm to about 700 mm, thereby improving productivity and cost competitiveness.

A recent trend is to develop a reel-to-reel or roll-to-roll semiconductor packaging process, thereby realizing a thinner semiconductor package. In general, a roll-to-roll process represents a technology for making electronic components from a plurality of flexible plastic or metal foils, and research and development have been conducted to make mass production more efficient by applying such a reel-to-reel (roll-to-roll) process to semiconductor packages. For example, as substrates used in semiconductor packages are thinned, a reel-to-reel process of winding and unwinding an element of semiconductor packages on a wheel is possible in a manufacturing process.

Semiconductor packages may be manufactured by a reel-to-reel process by winding copper and a resin on a reel, and heat and pressure applied to the substrate may be uniformly managed. When semiconductor packages are mass-produced by using the reel-to-reel process, manufacturing costs may be reduced by about 20% to about 60% compared to a unit panel process.

Therefore, even in the case of the PLPs as described above, a technique for applying a roll-to-roll process that may further reduce manufacturing costs than the unit panel process is required.

However, when a roll-to-roll continuous process is applied to a conventional panel level package, microcracks are generated in a molding layer (e.g., an epoxy molding compound (EMC)) formed of a resin and silica. These microcracks cause chemical leakage and delamination during a wet process and degrade product reliability. Therefore, there is a need for a method for applying a roll-to-roll process to panel level packaging.

SUMMARY

The inventive concept provides a flexible semiconductor package and a method of manufacturing the flexible semiconductor package, for producing a panel level package by a roll-to-roll process. However, such an objective is merely an example, and the scope of the inventive concept is not limited by the objective.

Additional aspects will be set forth in part in the description which follows and, in part, will be apparent from the description, or may be learned by practice of the presented embodiments of the disclosure.

According to one or more embodiments, a flexible semiconductor package includes a semiconductor chip accommodated in a cavity formed in a substrate, a molding layer covering an entire upper surface of the substrate and the cavity, and a wiring portion including an insulating layer and a redistribution member provided under lower surfaces of the substrate and the semiconductor chip, wherein the molding layer includes a pre-preg in which a resin is impregnated with a glass fabric, and the molding layer and the insulating layer are attached to the semiconductor chip accommodated in the cavity by a roll-to-roll continuous process.

The insulating layer may include a first insulating layer attached to the lower surfaces of the substrate and the semiconductor chip, a second insulating layer attached to a lower surface of the first insulating layer, and a wiring protection layer attached to a lower surface of the second insulating layer.

The second insulating layer may cover the redistribution member formed on the lower surface of the first insulating layer, wherein a via may be formed in the first insulating layer to electrically connect the redistribution member to the semiconductor chip.

The wiring protection layer may cover a redistribution pad formed on the lower surface of the second insulating layer.

The first insulating layer may include a photo imagable dielectric (PID), and the second insulating layer may include pre-preg.

In the pre-preg constituting the molding layer, the content of the resin relative to the glass fabric may be 60% or more.

The molding layer may be continuously laminated, exposed, and thermally cured by a guide action, a pressurization action, and a heating action of a roller in equipment for the roll-to-roll continuous process.

The molding layer may be laminated in a plurality of layers by the guide of a plurality of rollers.

The molding layer may be cured to have a cure degree of about 50% to about 80%.

Other aspects, features, and advantages of the present disclosure will become more apparent from the drawings, the claims, and the detailed description.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
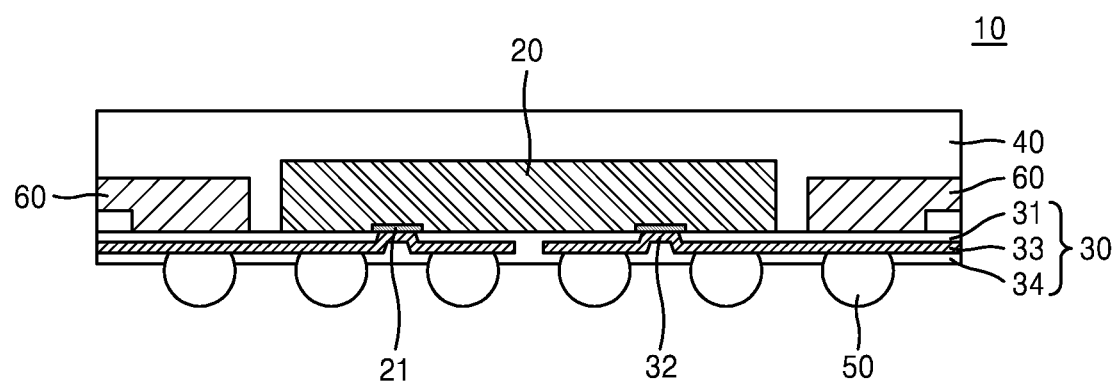
FIG. 1 is a schematic cross-sectional view showing the structure of a semiconductor package, which is a panel level package (PLP), as a comparative example for comparison with an embodiment of the inventive concept.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that although the terms "first," "second," etc. may be used herein to describe various elements, these elements should not be limited by these terms and these terms are only used to distinguish one element from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

In the drawings, the sizes of elements may be exaggerated or reduced for convenience of explanation. For example, the size and thickness of each element illustrated in the drawings are arbitrarily illustrated for convenience of explanation, and thus the present disclosure should not be limited to the illustrations of the drawings.

FIG. 1 is a schematic cross-sectional view showing the structure of a semiconductor package 10, which is a panel level package (PLP), as a comparative example for comparison with an embodiment of the inventive concept. Alternatively, the cross-sectional view of FIG. 1 may represent a wafer level package (WPL) structure.

At least a part of the description of the semiconductor package 10 according to the comparative example may be applied to a flexible semiconductor package 100 according to an embodiment of the inventive concept. For example, at least some components of the semiconductor package 10 according to the comparative example may be included in the flexible semiconductor package 100 according to the embodiment of the inventive concept.

Referring to FIG. 1, the semiconductor package 10 according to the comparative example may include a semiconductor chip 20, a wiring portion 30, a molding layer 40, and an external connection terminal 50. The wiring portion 30 includes an insulating layer 31, a wiring layer 33, and a wiring protection layer 34.

The semiconductor chip 20 has an active surface or an element circuit surface including an active region in which a circuit is formed, and a connection pad 21 for exchanging signals with the outside may be formed on the active surface.

The semiconductor chip 20 is mounted on the wiring portion 30 and is electrically connected to the wiring layer 33 of the wiring portion 30 through the connection pad 21.

The wiring portion 30 may electrically connect the semiconductor chip 20 to the external connection terminal 50. For example, in the wiring portion 30, the insulating layer 31 may be arranged between the semiconductor chip 20 and the wiring layer 33, and the wiring layer 33 may be electrically connected to the connection pad 21 of the semiconductor chip 20.

The wiring layer 33 may include, for example, a conductive metal such as copper, and a portion of the wiring layer 33 may be drawn out to a peripheral region of the semiconductor chip 20. For example, the wiring layer 33 may be connected to the connection pad 21 of the semiconductor chip 20 through a conductive portion 32 (or via portion) formed in the insulating layer 31. For example, the conductive portion 32 may be formed together with the wiring layer 33 and may be integrated with the wiring layer 33.

A plurality of external connection terminals 50 may be formed at a predetermined position of the wiring layer 33, and the wiring layer 33 may be connected to the external connection terminals 50.

The external connection terminal 50 is electrically connected to the wiring portion 30, and may be used as a medium for connecting the semiconductor package 10 to an external circuit. For example, one side of the external connection terminal 50 may be connected to the wiring layer 33, and the other side of the external connection terminal 50 may be exposed to the outside. The external connection terminal 50 may include, for example, a solder ball.

On the wiring layer 33 except for a junction with the external connection terminal 50, the wiring protection layer 34 (i.e., a solder resist layer) is formed.

The wiring portion 30 may redistribute the semiconductor chip 20 to form a circuit. That is, since the semiconductor chip 20 is redistributed by the wiring portion 30, the semiconductor package 10 may have a fan-out structure. Through this, the input/output terminals of the semiconductor chip 20 may be miniaturized and the number of input/output terminals may be increased.

The semiconductor package 10 according to the comparative example may further include a frame portion 60. For example, the semiconductor chip 20 is mounted in a housing portion formed in the frame portion 60. For example, the frame portion 60 may be used as the ground GND of a fan-out package. That is, the frame portion 60 may be used as an embedded ground plane (EGP) mounted in the fan-out package.

In the semiconductor package 10 according to the comparative example for comparison with an embodiment of the inventive concept, the molding layer 40 is formed to cover the upper surfaces of the semiconductor chip 20 and the frame portion 60. Therefore, the molding layer 40 may seal the semiconductor chip 20 and the frame portion 60. The molding layer 40 may integrate the semiconductor chip 20, the wiring portion 30, and the frame portion 60.

The molding layer 40 of the semiconductor package 10 according to the comparative example may include an epoxy molding compound (EMC). Alternatively, the molding layer 40 may be configured to include resin and silica. The molding layer 40 may be formed by a molding process.

By a method of manufacturing the semiconductor package 10, i.e., the panel level package, according to the comparative example for comparison with an embodiment of the inventive concept, an active surface (or device circuit surface) of the semiconductor chip 20 and a surface opposite to the active surface may be fixed to a support plate with an adhesive and the insulating layer 31 may be formed in a single layer to cover the active surface of the semiconductor chip 20. The wiring layer 33 may be formed on the insulating layer 31 and may include a conductive metal such as copper, and the conductive portion 32 may be formed together with the wiring layer 33 so that the wiring layer 33 is connected to the connection pad 21 through the conductive portion 32.

However, when a roll-to-roll continuous process is applied in manufacturing the semiconductor package 10 according to the comparative example as described above, microcracks are generated in the molding layer 40 including a resin and silica. These microcracks cause chemical leakage and delamination during a wet process and degrade product reliability. Through the flexible semiconductor package 100 according to an embodiment of the inventive concept, a roll-to-roll process may be applied to a panel level package without cracks.

Figure 2:
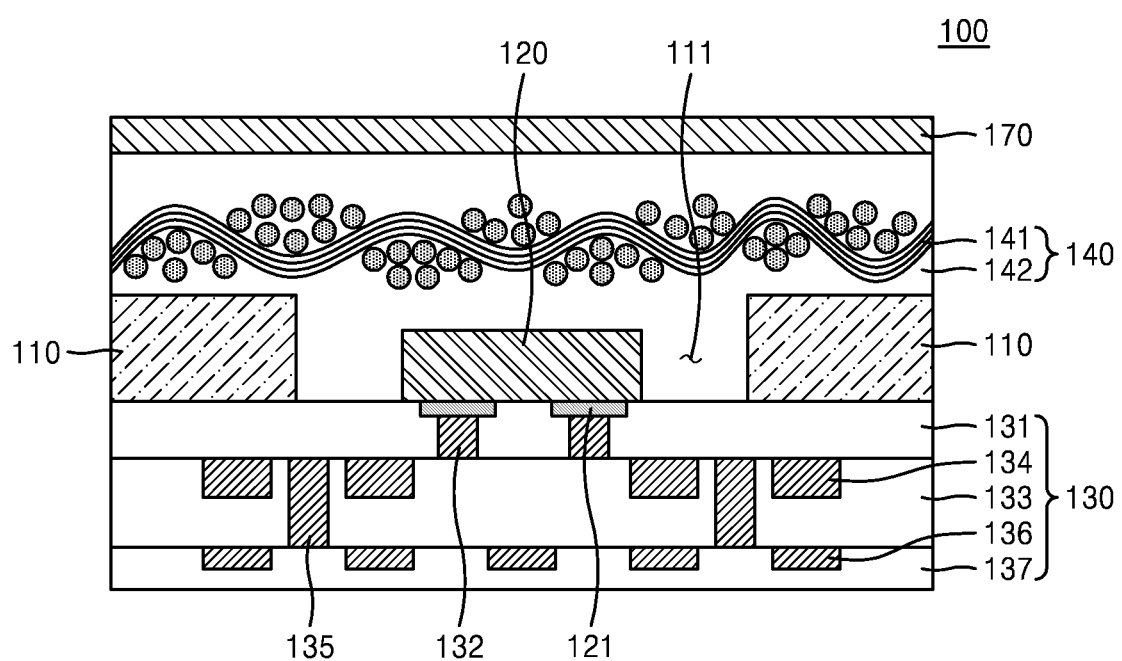
FIG. 2 is a schematic cross-sectional view showing the structure of a flexible semiconductor package according to an embodiment of the inventive concept.

FIG. 2 is a schematic cross-sectional view showing the structure of the flexible semiconductor package 100 according to an embodiment of the inventive concept. The flexible semiconductor package 100 according to the embodiment of the inventive concept is a PLP and may be packaged by a roll-to-roll continuous process.

Referring to FIG. 2, the flexible semiconductor package 100 according to the embodiment includes a semiconductor chip 120, a wiring portion 130, and a molding layer 140. The wiring portion 130 may include a first insulating layer 131, a second insulating layer 133, a redistribution member 134, a redistribution pad 136, and a wiring protection layer 137.

In the structure of the flexible semiconductor package 100, the semiconductor chip 120 is mounted on the wiring portion 130. The semiconductor chip 120 is electrically connected to the redistribution member 134 of the wiring portion 130 through an electrode pad 121 and a via 132.

The semiconductor chip 120 may be an integrated circuit (IC) or a die. The semiconductor chip 120 may have an active surface including an active region in which a circuit is formed, and the electrode pad 121 may be formed on the active surface to exchange signals with the outside.

For example, the electrode pad 121 may be integrally formed with the semiconductor chip 120. For another example, the electrode pad 121 may be a bump that is not integrally formed with the semiconductor chip 120 and attached to one surface of the semiconductor chip 120. The electrode pad 121 may include a conductive material, and may include, for example, a metal such as aluminum (Al).

The semiconductor chip 120 may be accommodated in a cavity 111 formed in a substrate 110. The semiconductor chip 120 may be embedded in the cavity 111 in an embedded manner. For example, the cavity 111 may be formed by drilling a hole in a rectangular panel or the substrate 110, and the semiconductor chip 120 may be attached into the cavity 111.

In this case, the height of the semiconductor chip 120 is configured to be lower than the height of the cavity 111. By forming the height of the upper surface of the semiconductor chip 120 to be lower than the height of the upper surface of the cavity 111, damage to the semiconductor chip 120 may be prevented when the molding layer 140 is bonded to the semiconductor chip 120 by a roll-to-roll process, and the adhesion between the semiconductor chip 120 and the molding layer 140 may be improved.

In an embodiment, the substrate 110 may include a copper clad laminate (CCL) or a flexible copper clad laminate (FCCL) formed by bonding a thin plate-like metal layer including copper (Cu) to both surfaces of an insulating layer including polyimide material.

As described above, the wiring portion 130 includes a first insulating layer 131, a second insulating layer 133, a redistribution member 134, a redistribution pad 136, and a wiring protection layer 137. The wiring portion 130 may electrically connect the semiconductor chip 120 to an external connection terminal (not shown).

The first insulating layer 131 is arranged on the lower surface of the semiconductor chip 120 (and the substrate 110), and is arranged between the semiconductor chip 120 and the redistribution member 134. In other words, the first insulating layer 131 is attached to a surface where the electrode pad 121 of the semiconductor chip 120 is located. The via 132 is formed in the first insulating layer 131 to pass through the first insulating layer 131 at a position corresponding to the electrode pad 121. The electrode pad 121 and the redistribution member 134 of the semiconductor chip 120 may be connected to each other through the via 132 including a conductive material.

The first insulating layer 131, which is a photosensitive insulating layer, may be a photo imagable dielectric (PID). The first insulating layer 131 may include a photocuring initiator and a photoreactive material, for photoreaction. In addition, the first insulating layer 131 may include a thermosetting resin (e.g., epoxy) and a curing agent, for thermosetting.

The redistribution member 134 is formed on the lower surface of the first insulating layer 131, and the second insulating layer 133 is arranged to cover the redistribution member 134. The redistribution member 134 may include a conductive metal such as copper. The redistribution member 134 may be connected to the electrode pad 121 of the semiconductor chip 120 through the via 132 formed in the first insulating layer 131.

The second insulating layer 133 may be attached to the lower surface of the first insulating layer 131 and may cover the redistribution member 134. A surface where the redistribution member 134 and the first insulating layer 131 contact each other and a surface where the second insulating layer 133 and the first insulating layer 131 contact each other may be coplanar. In addition, a portion of the redistribution member 134 may contact the via 132 penetrating the first insulating layer 131.

In addition, as a portion of the redistribution member 134, a via 135 penetrating the second insulating layer 133 is formed. Through the via 135, the redistribution pad 136 positioned below the redistribution member 134 and the redistribution member 134 may be connected to each other.

That is, a layer in which the first insulating layer 131 is positioned may be formed to include the vias 132, and a layer in which the second insulating layer 133 is positioned may be formed to include the redistribution member 134 and the via 135. In order to realize panel level packaging through a roll-to-roll process, the first insulating layer 131 and the second insulating layer 133 may be independent of each other and separated from each other.

The second insulating layer 133 may include pre-preg. By using a low dielectric constant material as the second insulating layer 133, it is possible to reduce the loss of a chip signal. The second insulating layer 133 may include, for example, at least one of hydrocarbons, cyanate ester, polyphenylene oxide (PPO), polyphenyl ether (PPE), modified epoxy, and bismalimide trazine (BT).

The redistribution pad 136 is formed on the lower surface of the second insulating layer 133, and the wiring protection layer 137 is arranged to cover the redistribution pad 136. The redistribution pad 136 may be electrically connected to the redistribution member 134 through the via 135 penetrating through the second insulating layer 133.

The wiring protection layer 137 may be attached to the lower surface of the second insulating layer 133 and may cover the redistribution pad 136. A surface where the redistribution pad 136 and the second insulating layer 133 contact each other and a surface where the wiring protection layer 137 and the second insulating layer 133 contact each other may be coplanar.

That is, a layer where the wiring protection layer 137 is position may be formed to include the redistribution pad 136. In order to be manufactured by a roll-to-roll continuous process, the wiring protection layer 137 may be independent of and separated from the first insulating layer 131 and the second insulating layer 133.

The wiring protection layer 137 may be a photo solder resist (PSR). The wiring protection layer 137 may include a photoinitiator and a photocuring resin, for photoreaction. In addition, the wiring protection layer 137 may include a thermosetting resin (e.g., epoxy) and a curing agent, for thermosetting.

Although not illustrated in the drawings, an external connection terminal (e.g., solder ball) may be connected to the redistribution pad 136.

As described above, the wiring portion 130 may redistribute the semiconductor chip 120 to form a circuit. Since the semiconductor chip 120 is redistributed by the wiring portion 130, the semiconductor package 100 may have a fan-out structure.

The flexible semiconductor package 100 according to the embodiment of the inventive concept includes the molding layer 140 that covers the upper surfaces of the semiconductor chip 120 and the substrate 110. The molding layer 140 includes a pre-preg in which a resin 142 is permeated or impregnated with a glass fabric 141. The molding layer 140 according to an embodiment of the inventive concept may not include silica, unlike a general molding layer. Through this, flexibility may be provided, and cracks of the molding layer 140 may be prevented in the roll-to-roll continuous process of the panel level package.

In the pre-preg forming the molding layer 140, the content of the resin 142 relative to the glass fabric 141 may be 60% or more.

The molding layer 140 may be cured to have a cure degree of about 50% to about 80% to improve the flexibility of the flexible semiconductor package 100.

Although not shown in the drawings, the molding layer 140 may include a plurality of layers. For example, in the roll-to-roll continuous process, the molding layer 140 may be laminated or bonded in a single layer, or may be laminated or bonded in multiple layers. For example, in the molding layer 140, a first layer directly bonded to the upper surfaces of the semiconductor chip 120 and the substrate 110 serves as a mold for sealing and integrating the semiconductor chip 120 and the substrate 110. In addition, one or more layers bonded to the upper surface of the first layer may control warpage.

On the upper surface of the molding layer 40, a support layer 170 may be stacked. The support layer 170 may include copper (Cu), for example, copper foil. The support layer 170 may prevent cracking of the semiconductor chip 120. The support layer 170 may have a thickness selected from among 2 um, 3 um, 12 um, and 18 um. However, the inventive concept is not limited thereto. In some embodiments, the support layer 170 may be removed.

FIGS. 3 to 9 illustrate a process of manufacturing the flexible semiconductor package 100 according to an embodiment of the inventive concept.

Figure 3:
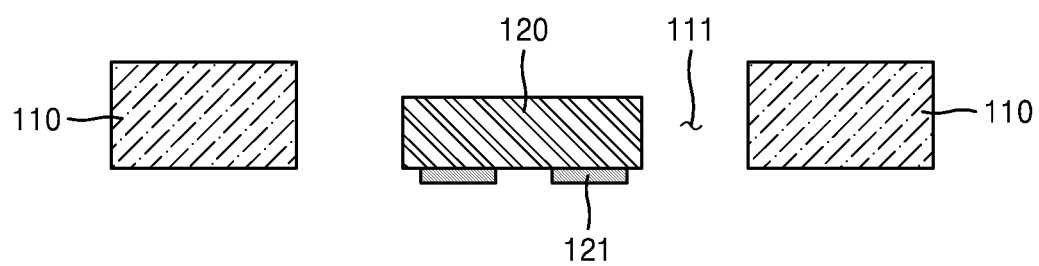
FIGS. 3 to 9 illustrate a process of manufacturing a flexible semiconductor package, according to an embodiment of the inventive concept.

Referring to FIG. 3, the semiconductor chip 120 may be embedded in the cavity 111 formed in the substrate 110 in an embedded manner. For example, the cavity 111 may be formed by drilling a hole in a rectangular panel or the substrate 110 in a size that may accommodate the semiconductor chip 120, and the semiconductor chip 120 may be attached into the cavity 111. The electrode pad 121 of the semiconductor chip 120 may be attached to face the lower surface of the cavity 111. In this case, the upper surface of the semiconductor chip 120 may be positioned to be lower than the upper surface of the substrate 110.

Figure 4:
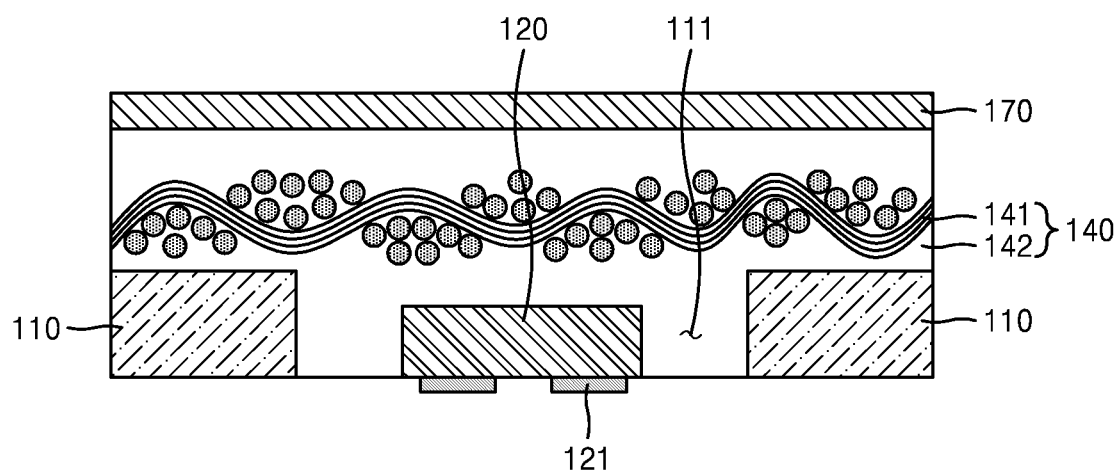

Referring to FIG. 4, the molding layer 140 may be bonded to the upper surfaces of the substrate 110 and the semiconductor chip 120 by a roll-to-roll continuous process, and the support layer 170 may be bonded to the upper surface of the molding layer 140. For example, the molding layer 140 and the support layer 170 may be guided by one or more rollers, and thus, the semiconductor chip 120 may be arranged on the upper surface of the substrate 110 embedded in the cavity 111 and may be pressed and heated. For example, the molding layer 140 and the support layer 170 may be formed together by a pressing action of a pressing roll. Heat may be applied to the molding layer 140 and the support layer 170 during the pressing action.

In this case, the height of the substrate 110 may be greater than the height of the semiconductor chip 120, so that the resin of the pre-preg of the molding layer 140 may be sufficiently bonded to the semiconductor chip 120. Through this, the adhesion between the resin of the pre-preg of the molding layer 140 and the semiconductor chip 120 may be improved.

The support layer 170 may include copper (Cu) and may prevent cracking of the semiconductor chip 120. The support layer 170 may be removed later and may not be removed in some embodiments.

According to an embodiment, lamination and curing of the molding layer 140 and lamination of the support layer 170 may be continuously performed in a roll-to-roll lamination equipment. According to an embodiment, the molding layer 140 may be laminated in a single layer or may be laminated in a plurality of layers.

Figure 5:
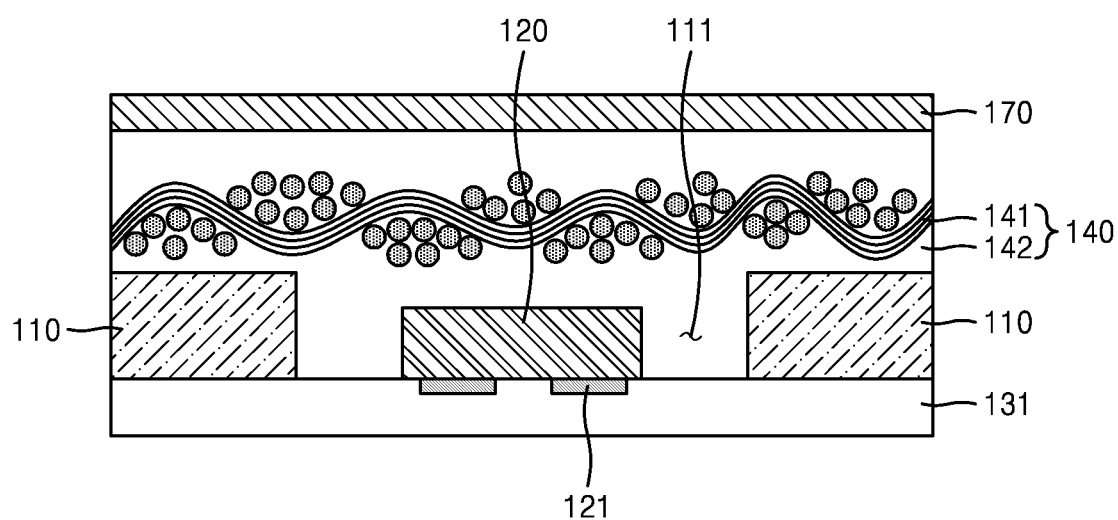
Figure 6:
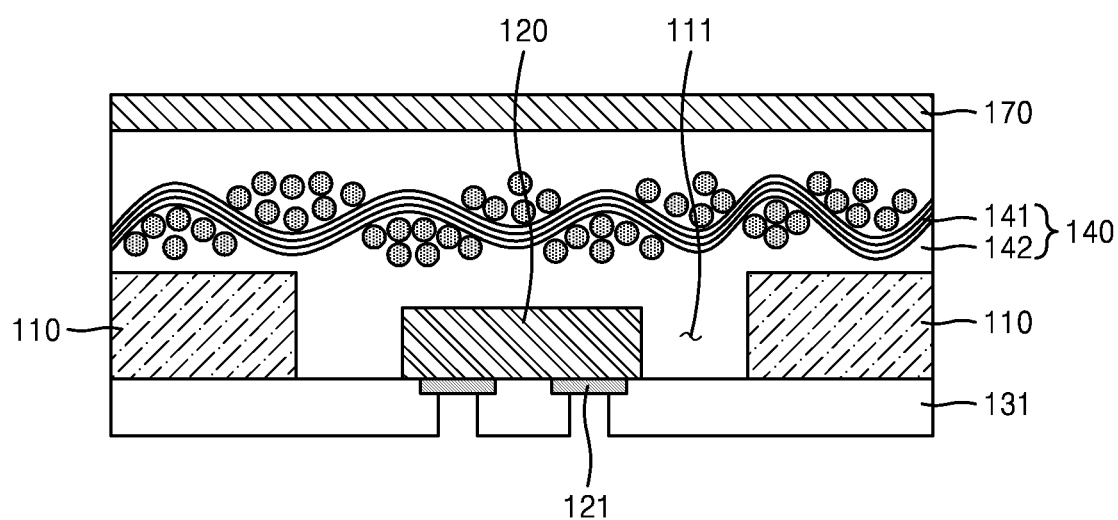

Referring to FIG. 5, the first insulating layer 131 may be attached to a surface of the semiconductor chip 120 having the electrode pad 121 by a roll-to-roll continuous process. The first insulating layer 131 may be guided by a roller and arranged on the lower surface of the semiconductor chip 120. Referring to FIG. 6, a through hole may be formed at a position corresponding to the electrode pad 121 in the first insulating layer 131. The first insulating layer 131 may include, for example, a PID, and the lamination, exposure, and thermal curing of the first insulating layer 131 may be continuously performed by roll-to-roll continuous process equipment.

Figure 7:
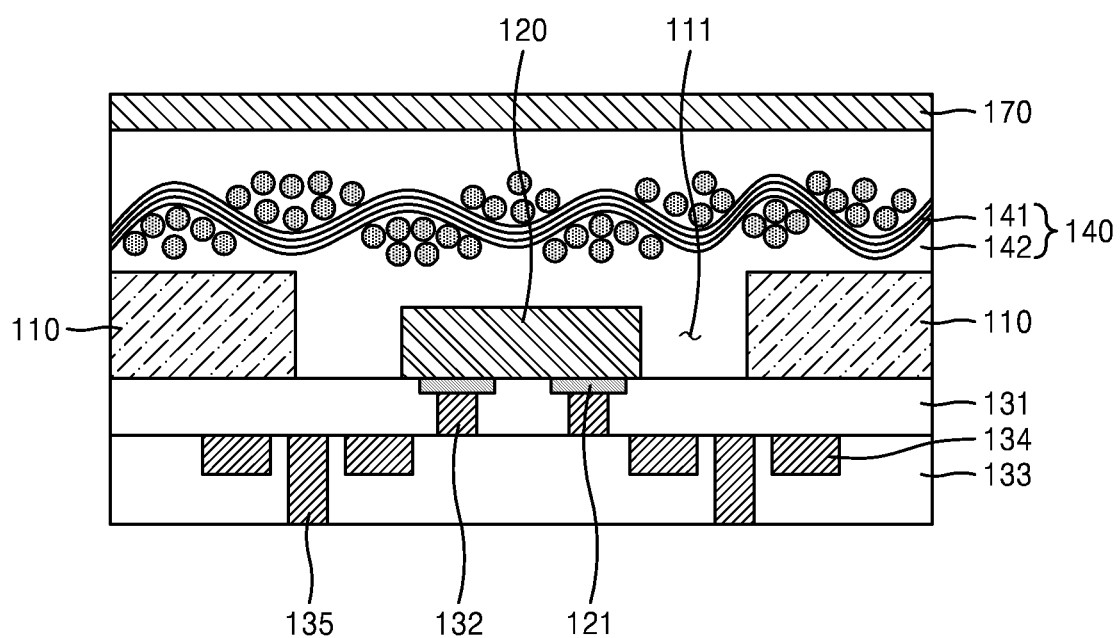

Referring to FIG. 7, the via 132 may be formed in the through hole and may include a conductive material, and the redistribution member 134 may be formed on the lower surface of the first insulating layer 131 and the second insulating layer 133 may be bonded to the lower surface of the first insulating layer 131 and the redistribution member 134 by a roll-to-roll continuous process. For example, the second insulating layer 133 may be arranged to be guided by a roller and stacked on the lower surface of the first insulating layer 131.

The second insulating layer 133 may include, for example, a pre-preg of a low dielectric constant material, and the lamination of the second insulating layer 133 may be continuously performed by roll-to-roll continuous process equipment.

Figure 8:
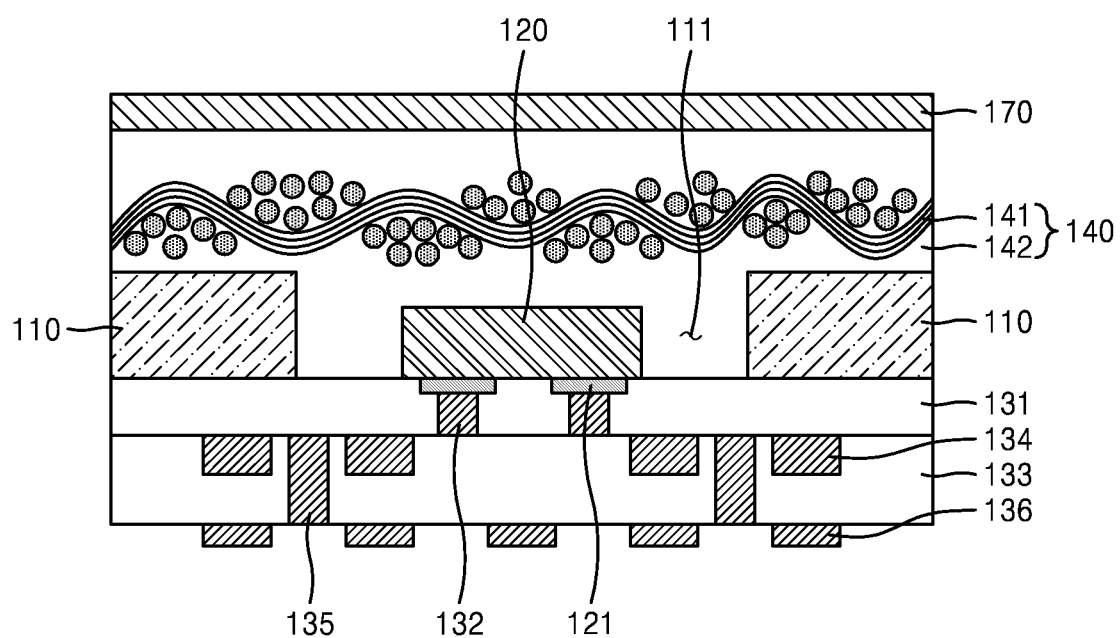
Figure 9:
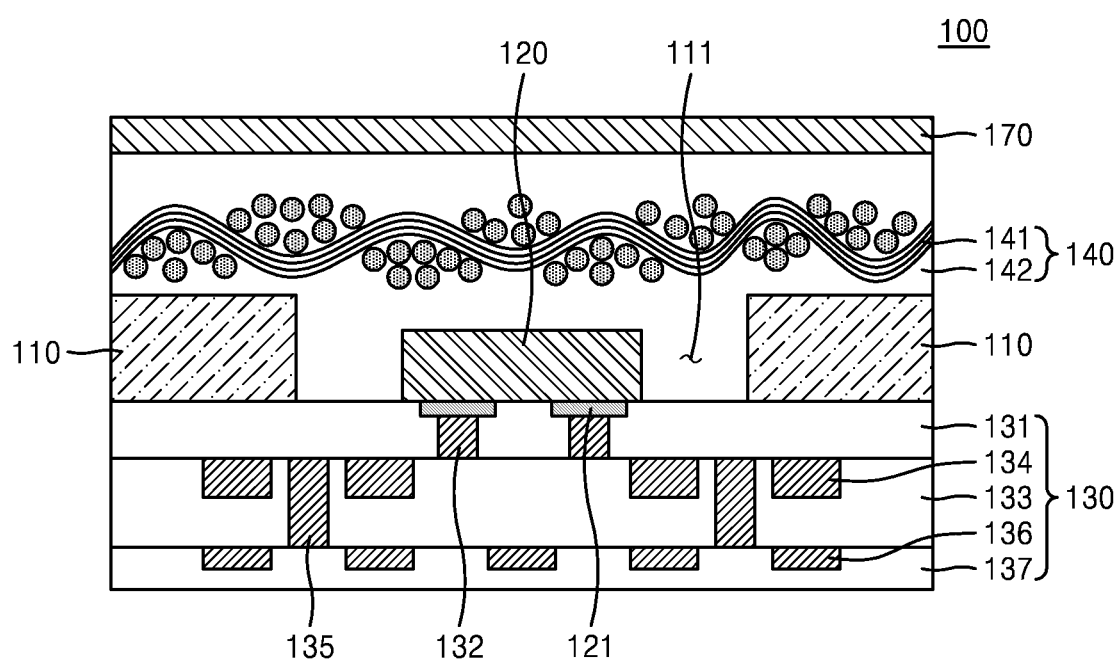

Referring to FIGS. 8 and 9, the redistribution pad 136 may be formed on the lower surface of the second insulating layer 133, and the wiring protection layer 137 may be attached by the roll-to-roll continuous process to cover the redistribution pad 136. The wiring protection layer 137 may include, for example, a PSR, and the lamination, exposure, and thermal curing of the wiring protection layer 137 may be continuously performed by roll-to-roll continuous process equipment.

Since the flexible semiconductor package 100 according to the embodiment of the inventive concept is formed by a roll-to-roll continuous process, it is not necessarily limited to the order shown in FIGS. 3 to 9.

By applying the structure of the flexible semiconductor package 100 including the molding layer 140, the first insulating layer 131, and the second insulating layer 133 as described above, a panel level package may be made by using a roll-to-roll continuous process.

As described above, according to embodiments of the inventive concept, a flexible semiconductor package and a method of manufacturing the flexible semiconductor package may be provided. A roll-to-roll process may be used to produce a panel level package.

Of course, the scope of the inventive concept is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A flexible semiconductor package comprising:
   a substrate having a molding layer bonded thereto, the substrate including:
      a bonding area to bond with a lower surface of the molding layer; and
      a cavity in which a semiconductor chip is located;
   wherein the molding layer includes different sections, wherein a bottom section of the different sections includes the lower surface of the molding layer and an upper section of the different sections is arranged to control warpage, wherein the molding layer encloses the cavity; and
   a wiring portion including an insulating layer and a redistribution member provided under lower surfaces of the substrate and the semiconductor chip,
   wherein the molding layer comprises a pre-preg in which a resin is impregnated with a glass fabric, and
   the molding layer and the insulating layer are attached to the semiconductor chip accommodated in the cavity by a roll-to-roll continuous process.

2. The flexible semiconductor package of claim 1, wherein the insulating layer comprises:
   a first insulating layer attached to the lower surfaces of the substrate and the semiconductor chip;
   a second insulating layer attached to a lower surface of the first insulating layer; and
   a wiring protection layer attached to a lower surface of the second insulating layer.

3. The flexible semiconductor package of claim 2, wherein the second insulating layer covers the redistribution member formed on the lower surface of the first insulating layer,
   wherein a via is formed in the first insulating layer to electrically connect the redistribution member to the semiconductor chip.

4. The flexible semiconductor package of claim 3, wherein the wiring protection layer covers a redistribution pad formed on the lower surface of the second insulating layer.

5. The flexible semiconductor package of claim 3, wherein
   the first insulating layer comprises a photo imagable dielectric (PID), and
   the second insulating layer comprises pre-preg.

6. The flexible semiconductor package of claim 1, wherein in the pre-preg constituting the molding layer, a content of the resin relative to the glass fabric is 60% or more.

7. The flexible semiconductor package of claim 1, wherein the molding layer is continuously laminated, exposed, and thermally cured by a guide action, a pressurization action, and a heating action of a roller in equipment for the roll-to-roll continuous process.

8. The flexible semiconductor package of claim 7, wherein the molding layer is laminated in a plurality of layers by a guide of a plurality of rollers.

9. The flexible semiconductor package of claim 7, wherein the molding layer is cured to have a cure degree of about 50% to about 80%.

10. The flexible semiconductor package of claim 1, wherein a depth of the cavity is greater than a height of the semiconductor chip, and wherein another part of the lower surface of the molding layer is located in the cavity.

11. The flexible semiconductor package of claim 1, wherein the molding layer does not include silica.

12. The flexible semiconductor package of claim 1, wherein the cavity comprises a drill hole in the substrate.

13. The flexible semiconductor package of claim 12, wherein in the pre-preg constituting the molding layer, a content of the resin relative to the glass fabric is 60% or more.

14. The flexible semiconductor package of claim 12, wherein the molding layer is continuously laminated, exposed, and thermally cured by a guide action, a pressurization action, and a heating action of a roller in equipment for the roll-to-roll continuous process.

15. The flexible semiconductor package of claim 14, wherein the molding layer is laminated in a plurality of layers by a guide of a plurality of rollers.

16. The flexible semiconductor package of claim 14, wherein the molding layer is cured to have a cure degree of about 50% to about 80%.

17. A flexible semiconductor package comprising:
   a semiconductor chip accommodated in a cavity formed in a substrate;
   a molding layer covering an entire upper surface of the substrate and the cavity, wherein a depth of the cavity is greater than a height of the semiconductor chip, and wherein part of a bottom surface of the molding layer contacts an upper surface of the semiconductor chip and said part of the bottom surface is located in the cavity; and a wiring portion including an insulating layer and a redistribution member provided under lower surfaces of the substrate and the semiconductor chip, wherein the molding layer comprises a pre-preg in which a resin is impregnated with a glass fabric, and the molding layer and the insulating layer are attached to the semiconductor chip accommodated in the cavity by a roll-to-roll continuous process.

18. The flexible semiconductor package of claim 17, wherein the insulating layer comprises:

a first insulating layer attached to the lower surfaces of the substrate and the semiconductor chip;

a second insulating layer attached to a lower surface of the first insulating layer; and a wiring protection layer attached to a lower surface of the second insulating layer, wherein the second insulating layer covers the redistribution member formed on the lower surface of the first insulating layer, wherein a via is formed in the first insulating layer to electrically connect the redistribution member to the semiconductor chip.

19. The flexible semiconductor package of claim 18, wherein the wiring protection layer covers a redistribution pad formed on the lower surface of the second insulating layer.

20. The flexible semiconductor package of claim 18, wherein the first insulating layer comprises a photo imagable dielectric (PID), and the second insulating layer comprises pre-preg.

\* \* \* \* \*